United States Patent [19]

Boutros

[11] 4,144,509

[45] Mar. 13, 1979

[54] FILTER CONNECTOR

[75] Inventor: Kamal S. Boutros, Downsview, Canada

[73] Assignee: Bunker Ramo Corporation, Oak Brook, Ill.

[21] Appl. No.: 758,565

[22] Filed: Jan. 12, 1977

[51] Int. Cl.$^{2}$ ...................... H03H 7/04; H03H 13/00; H01R 13/66; H01G 4/40

[52] U.S. Cl. .................................. 333/181; 333/185; 339/147 R; 361/302

[58] Field of Search ................. 333/70 R, 70 S, 70 C, 333/79; 339/147 R, 147 C, 143 R, 207 R; 361/301-303, 306, 312

[56] References Cited

U.S. PATENT DOCUMENTS

| | | | |
|---|---|---|---|
| 3,538,464 | 11/1970 | Walsh | 333/79 |
| 3,546,638 | 12/1970 | Park | 333/79 |
| 3,613,033 | 10/1971 | Denes | 333/79 |
| 3,854,107 | 12/1974 | Tuchto et al. | 333/79 |
| 4,079,343 | 3/1978 | Nijman | 333/79 |
| 4,083,022 | 4/1978 | Nijman | 333/79 |

*Primary Examiner*—Alfred E. Smith
*Assistant Examiner*—Marvin Nussbaum
*Attorney, Agent, or Firm*—William Lohff; F. M. Arbuckle

[57] ABSTRACT

An electrical filter connector includes a housing in which a dielectric insert member is positioned. A plurality of pin contacts extend through the dielectric member in parallel-spaced alignment for engaging complimentarily positioned contacts on mating connectors. Ferrite sleeves positioned over the pin contacts coact with individual metal layers deposited on the front and rear surfaces of the dielectric block and a central metal layer within the block to form individual pi filter networks for each pin contact. Electrical connections are maintained between the pin contacts and the individual metal layers by means of solder bridges which extend over the ends of the ferrite sleeves.

9 Claims, 7 Drawing Figures

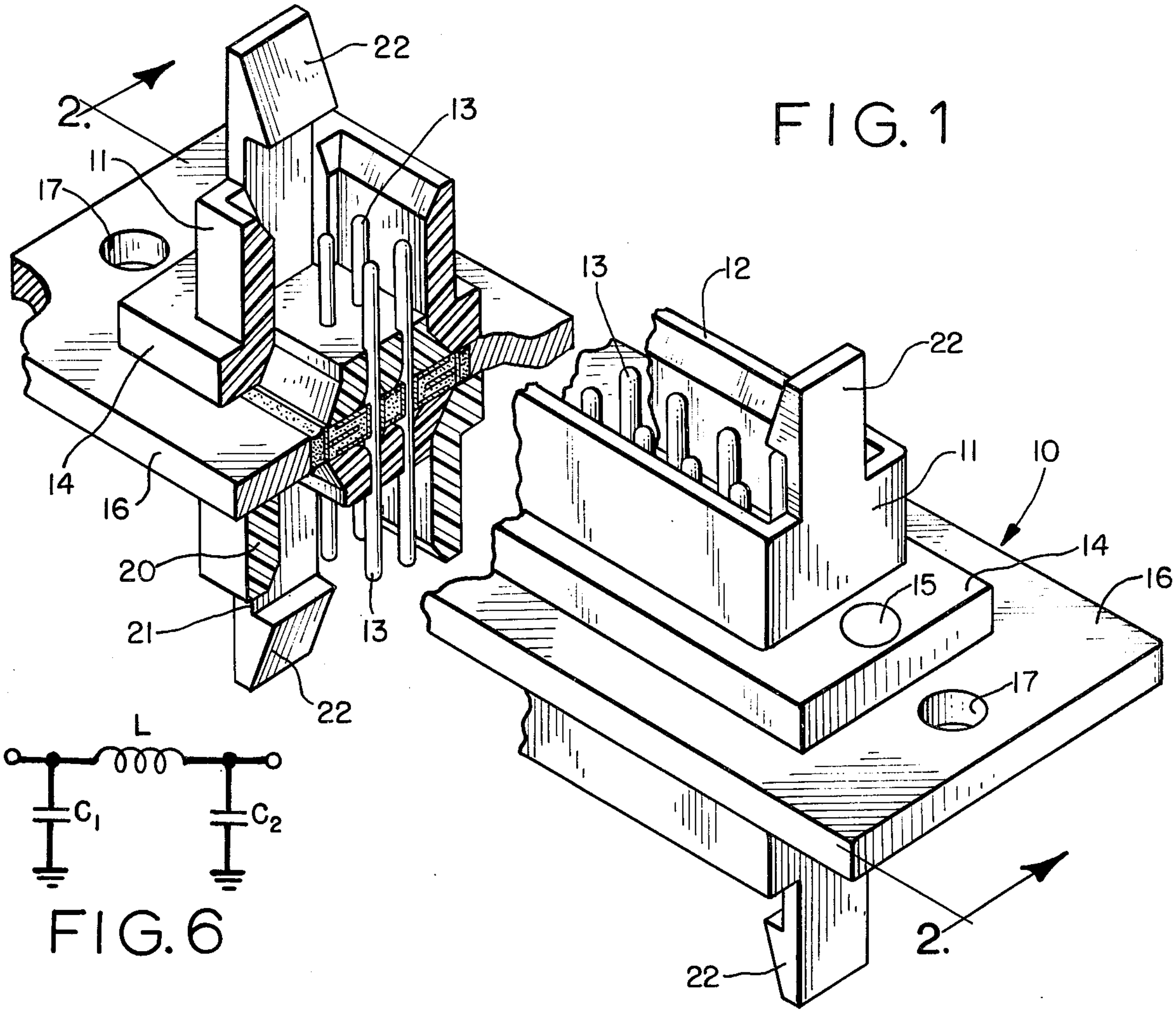
FIG. 1
FIG. 6
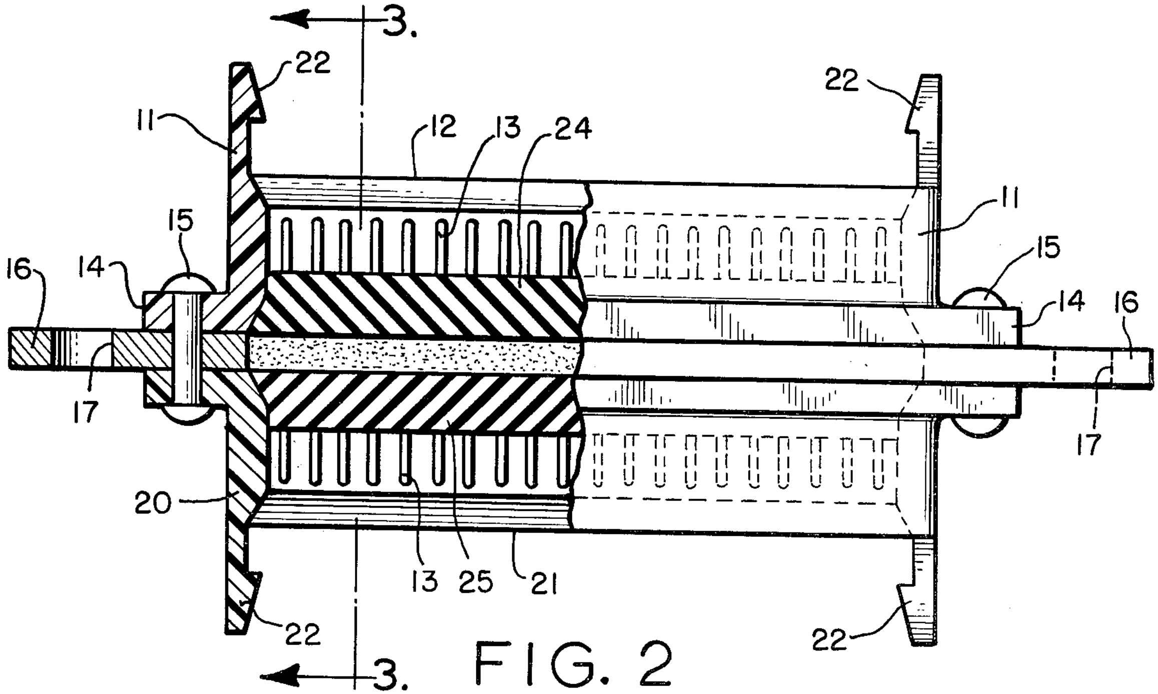
FIG. 2

FIG. 3
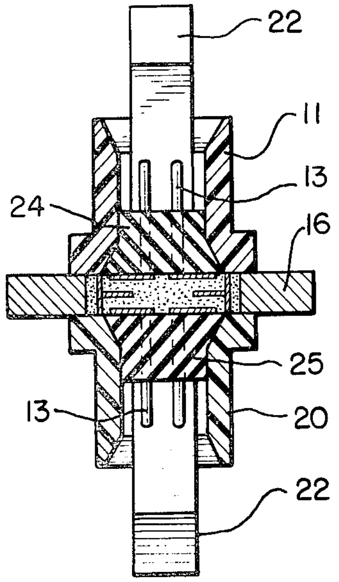
FIG. 4
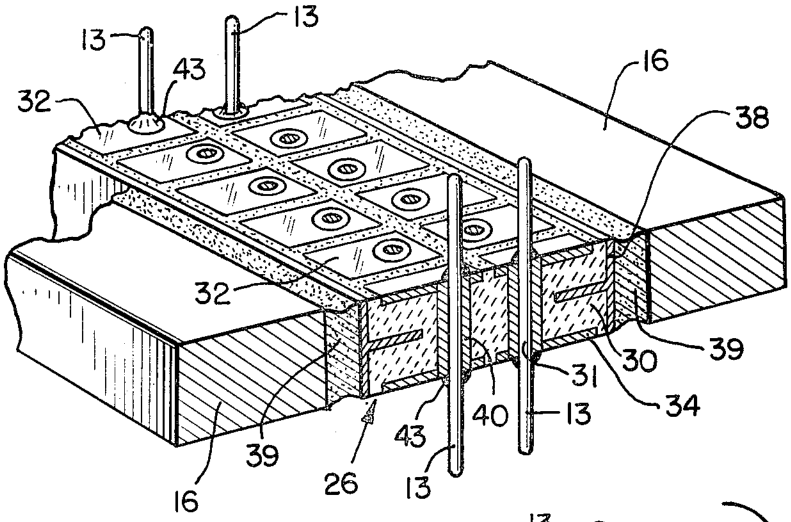
FIG. 3a
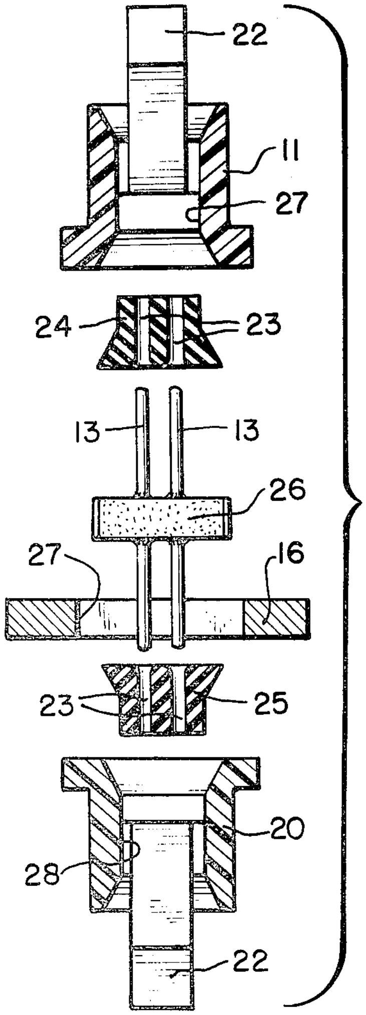
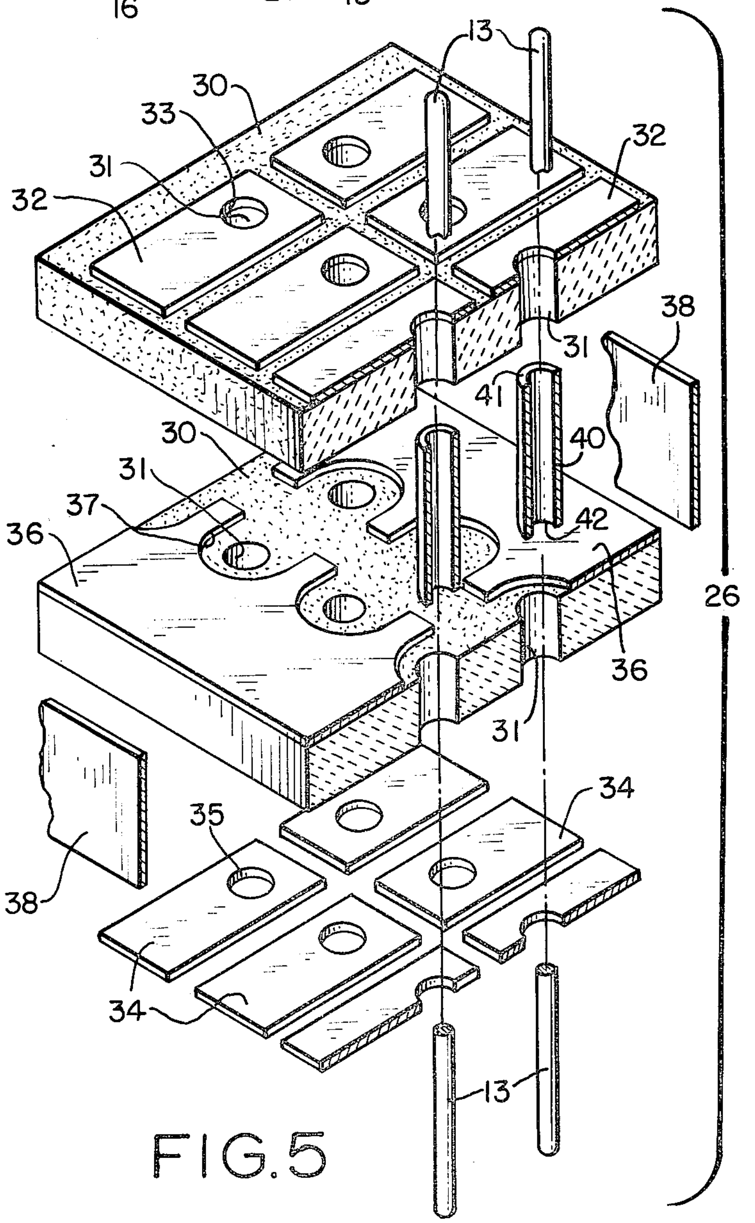
FIG. 5

FILTER CONNECTOR

BACKGROUND OF THE INVENTION

The present invention is directed generally to electrical connector assemblies, and more particularly to an improved multiple contact connector incorporating an improved filter pin assembly therein.

In numerous applications, such as in the computer field, where long unshielded cable runs enter a shielded housing containing processing circuitry susceptible to extraneous signals picked up by the cable, it is necessary to provide electrical filter networks as an integral part of a connector to surpress transients and other undesired signals which may exist on circuits interconnected by the connector. Typically, such filter networks take the form of small filter pin assemblies which take the place of conventional pin contacts in the connector, and provide the electrical equivalent of a pi network filter with respect to the circuit with which they are associated.

Because of space limitations and the undesirably complex construction of prior art filter pin assemblies, it has heretofore been undesireably and expensive to incorporate filter pin assemblies in high density multiple contact connectors. The present invention is directed to an improved high density filter connector construction which requires fewer components and is less expensive to construct.

Accordingly, it is a general object of the present invention to provide a new and improved multiple contact filter connector.

It is another object of the present invention to provide a new and improved filter connector which is simpler in construction and more economical to construct.

It is another object of the present invention to provide a new and improved filter connector assembly which is mechanically more rugged in construction.

It is another object of the present invention to provide a new and improved filter pin assembly for use in a multiple contact filter connector.

It is another object of the present invention to provide a new and improved filter pin assembly for use in a multiple contact filter connector which is simpler in construction and more economical to construct.

SUMMARY OF THE INVENTION

The invention is directed to an electrical connector including a housing defining an insert-receiving recess having a forward mating end. A dielectric insert member carried within the recess has a front surface and a rear surface, and includes at least one axially-extending contact-receiving passageway extending therethrough. An inductance member coaxially disposed within the passageway has a front end exposed on the front surface and a rear end exposed on the rear surface. A pin contact extending through the inductance member includes a first projecting portion projecting from the front surface, and a second projecting portion projecting from the rear surface, and a body portion within the inductance member. First and second electrically conductive layers are disposed on the front and rear surfaces of the dielectric member and first and second connecting means are provided for electrically connecting the first and second layers to the first and second projecting portions of the contact pin. A third conductive layer is disposed within the dielectric member between the first and second layers for forming in conjunction therewith capacitive elements at respective ends of the pin contact body portion, and grounding means are provided for electrically grounding the third conductive layer to establish in conjunction with the inductance member a pi-network filter element for the pin contact.

BRIEF DESCRIPTION OF THE DRAWINGS

The features of the present invention, which are believed to be novel, are set forth with particularly in the appended claims. The invention, together with the further objects and advantages thereof, may best be understood by reference to the following description taken in connection with the accompanying drawings, in the several figures of which like reference numerals identify like elements, and in which:

FIG. 1 is a perspective view of a multiple contact filter connected constructed in accordance with the invention partially broken away to show its interior construction.

FIG. 2 is a side elevational view of the filter connector of FIG. 1 partially in cross-section.

FIG. 3 is a cross-sectional view of the filter connector taken along line 3—3 of FIG. 2.

FIG. 3*a* is a cross-sectional view similar to FIG. 3 exploded to better illustrate the individual components of the filter connector.

FIG. 4 is an enlarged perspective view partially in cross-section of the filter connector illustrating the construction and positioning of the filter pin assemblies incorporated therein.

FIG. 5 is an enlarged perspective view of the insert portion of the filter connector exploded to better illustrate the individual elements contained therein.

FIG. 6 is a simplified electrical schematic circuit diagram of the pi filter network achieved by each of the filter pin assemblies contained in the filter connector of the invention.

DESCRIPTION OF THE PREFERRED EMBODIMENT

Referring to the figures, and particularly to FIGS. 1 and 2, a multiple contact filter connector 10 comprises a housing 11 of generally rectangular cross-section having a forward or mating end 12 for telescoping engagement with the shell of a firt mating connector (not shown). A plurality of pin contacts 13 are positioned within housing 11 in parallel-spaced relation for the purpose of establishing electrical communication with respective ones of complimentarily positioned contacts in the first mating connector. Housing section 11 includes a base portion 14 which is attached by rivets 15 or other appropriate fastening means to a rectangular flange plate 16, which is preferably formed of an electrically conductive metal material. This flange plate may include a plurality of apertures 17 for mounting the connector 10 to a bulkhead (not shown) or other flat mounting surface.

The filter connector 10 includes on the opposite surface of plate 16 a second housing section 20 which may be identical in form to housing section 11. The forward or mating end 21 of this housing section is arranged for telescoping engagement with the shell of a second mating connector (not shown) to electrically connect the opposite ends of the pin contacts 13 with respective contacts in the second mating connector. Housing sections 11 and 20 each include a pair of projecting pawl-like tab portions 22 arranged in opposing relationship to secure the first and second mating connectors to connector 10.

Referring to FIGS. 3 and 3*a*, pin contacts 13 are received in respective contact receiving passageways 23 of front and rear gasket members 24 and 25, which may be formed of a semi-resilient potting compound. The gasket members 24 and 25 are arranged on opposite sides of a central dielectric filter assembly 26 and are externally dimensioned to fit snugly within recesses 27 and 28 provided within housing sections 11 and 20, respectively. The dielectric filter assembly 26 is received within a rectangular aperture 27 in flange plate 16 so that when the two housing sections 11 and 20 are fastened in position as shown in FIG. 3, a tight compression fit is formed between the gasket members and the dielectric insert assembly with the pin contacts 13 held in parallel-spaced relationship to the axis of the connector. The gaskets 24 and 25 allow sufficient lateral movement of pin contacts 13 to facilitate realignment of the pin contacts with mating contacts in the first and second mating connectors.

Referring to FIGS. 4 and 5, the dielectric insert assembly 26 includes an insert block 30 of suitably high dielectric constant such as barium titanate through which a plurality of apertures 31 are provided for receiving respective ones of the contact pins 13. A first plurality of thin electrically conductive plates 32 is provided on the front surface of the dielectric block 30. These plates, which may be formed by depositing a thin layer of a metal such as copper on the dielectric block, are positioned so as to overly respective ones of apertures 31, and include appropriately aligned apertures 33 for receiving the pin contacts 13. Similarly, a second plurality of conductive plates 34 is provided on the rear surface of dielectric block 30 with individual apertures 35 associated with respective ones of apertures 31.

The filter insert assembly 26 further includes an electrically conductive layer 36 disposed intermediate plates 32 and 34 in parallel-spaced relationship thereto so as to form therewith individual capacitive elements associated with each pin contact 13. Layer 36 is physically and electrically isolated from apertures 31, being provided with an interior boundary 37 providing lateral separation from each of the apertures. Additional electrically conductive layers 38 are provided on each sidewall of the dielectric insert block 30 to establish electrical communication with layer 36. These additional layers 38 are grounded to the electrically conductive flange 16 of connector 10 by appropriate means such as a layer of conductive epoxy 39 (FIG. 4) or a flat elongated grounding spring (not shown). A gap is maintained between the edges of the electrically conductive plates 32 and 34 and the additional layers 38 to maintain electrical isolation between these elements.

Each of the contact pins 13 has associated with it a sleeve-shaped ferrite element 40 concentrically received within the corresponding aperture 31 in dielectric block 31. These ferrite elements 40 extend through the dielectric block 30, having top and bottom ends 41 and 42 flush with the top and bottom surfaces, respectively, of the dielectric block.

In an assembled state, the individual electrically conductive plates 32 and 34 are connected to respective ones of pin contacts 13 as the pin contacts pass through their associated apertures by appropriate electrical bounding means such as solder portions 43. The solder portions, in addition to establishing electrical continuity between the electrically conductive plates and the contact pins, serve to retain the ferrite elements 40 associated with the contact pins in position within their respective apertures 31 in dielectric block 30.

In operation, electrically conductive layer 36 is grounded through layers 38 and 39, and electrically conductive plates 32 form in conjunction with the parallel-spaced layer 36 a first plurality of individual capacitor elements C1 between the pin contacts 13 and ground. Similarly, electrically conductive plates 34 form in conjunction with plate 36 a second plurality of individual capacitor elements C2 between the pin contacts and ground. Ferrite sleeves 40, which are fitted over contact pins 13 between the first and second capacitor elements established at either end thereof, provide a series inductance element L with respect to each pin. Thus, a pi network filter circuit is formed as illustrated in FIG. 6.

The operating frequency of the filter network for each pin contact is dependent on the capacitance of the capacitive elements C1 and C2 and on the inductance of the inductance element L. By varying the area of the contact plates 32 and 34 associated with a pin contact, the electrical characteristics of the filter network associated with that pin contact can be independently determined. The capacity of the capacitive elements can also be varied by varying the spacing between the central conductive layer 36 and the individual contact plates 32 and 34, either by varying the thickness of the dielectric block 30, or by providing additional parallel-spaced layers adjacent the contact plates. Thus, a variety of predetermined filter characteristics can be provided within the connector without an increase in manufacturing costs.

By reason of the ends 41 and 42 of the ferrite sleeves 40 being exposed flush with the surfaces of dielectric block 30, a continuous support surface is formed for the conductive solder bond between contact pins 13 and the electrically conductive plates 32 and 34. This obviates the need for metalization of the ferrite sleeves 40 since these elements are not required for achieving electrical interconnections. The result is a simplification of the manufacturing process and a corollary savings in manufacturing costs.

The dielectric insert assembly 26 is formed by conventional manufacturing methods, the electrically conductive layers 32, 34 and 36 being deposited therein and thereon during formation. Once the dielectric block 30 is formed, the contact pins 13 and ferrite sleeve elements 40 are inserted in apertures 31. The electrically conductive solder bonds 43 are then formed and the resulting assembly is mounted within the aperture 27 of flange 16 and bounded thereto by epoxy layer 39. The upper and lower housing sections 11 and 12 and the upper and lower gasket portions 24 and 25 are then inserted over the contact pins 13 and the upper and lower housing sections 11 and 20 are attached to flange 16 by means of rivets 15.

Although connector 10 is shown as accepting a first and second mating connector on either end thereof, it will be appreciated that one end of this connector could be provided with wire end termination means. For example, pin contacts 13 could be provided at their rear end with wire wrap or lug surfaces suitable for receiving individual conductors instead of a mating connector. Also, although two electrically independent layers 36 are shown in dielectric block 30, it would be possible to provide a single layer with appropriate apertures to maintain electrical isolation from apertures 31.

Thus, the present invention provides a connector having a large number of individual contact pins for which individual filtering characteristics are provided. The connector requires a minimal number of individual components and lends itself to assembly by known manufacturing techniques.

While one embodiment of the invention has been shown and described, it wil be obvious to those skilled in the art that changes and modifications may be made without departing from the invention in its broader aspects and, therefore, the aim in the appended claims is to cover all such changes and modifications as fall within the true spirit and scope of the invention.

I claim:

1. An electrical connector comprising, in combination:

- a housing defining an insert-receiving recess;
- a dielectric insert member carried within said recess, said dielectric member having a front surface and a rear surface, and including at least one axially extending contact-receiving passageway extending therethrough;
- a sleeve-shaped inductance member coaxially disposed within said passageway, said inductance member having a front end exposed on said front surface and a rear end exposed on said rear surface;
- a pin contact extending through said inductance member and including a first projecting portion projecting from said front surface, and a second projecting portion projecting from said rear surface, and a body portion within said inductance member;
- first and second electrically conductive layers disposed on said front and rear surfaces of said dielectric member, respectively, said dielectric member and said inductance member isolating said first and second electrically conductive layers from direct electrical interengagement with each other;
- first and second connecting means disposed exterior to said dielectric member and said conductive layers for electrically connecting said first and second layers to said first and second projecting portions of said contact pin, respectively;
- means including a third electrically conductive layer disposed within said dielectric member between said first and second layers for forming in conjunction therewith capacitive elements at respective ends of said body portion of said pin contact; and
- grounding means for electrically grounding said third conductive layer to establish in conjunction with said inductance member a pi-network filter element for said pin contact.

2. An electrical connector as defined in claim 1 wherein said first and second ends of said inductance member are substantially flush with said front and rear surfaces of said dielectric member, respectively.

3. An electrical connector as defined in claim 1 wherein said first and second connecting means comprise solder bonds between respective contact pin portions and said layers.

4. An electrical connector as defined in claim 1 including first and second gasket members disposed over said front and rear surfaces of said dielectric member within said housing.

5. An electrical connector as defined in claim 1 wherein said dielectric member includes side walls, and said grounding means extend between said housing and said side walls.

6. An electrical connector as defined in claim 5 including an additional electrically conductive layer on at least one of said sidewalls, and said grounding means extend between said additional layer and said housing.

7. An electrical connector as defined in claim 6 wherein said housing includes a central electrically conductive flange portion having an aperture therein, said dielectric member being disposed within said aperture, and front and rear shell portions disposed on either side of said flange portion, and wherein said grounding means extend between said additional layer and said flange portion.

8. An electrical connector as defined in claim 7 wherein said grounding means comprise a layer of electrically conductive epoxy.

9. An electrical connector comprising, in combination:

- a housing having a central flange portion, and front and rear shell portions disposed on opposite sides of said flange portion, defining an insert receiving recess;
- a dielectric member carried within said recess, said dielectric member having a front surface and a rear surface, and including at least one axially-extending contact-receiving passageway extending therethrough;
- a pin contact extending through said contact receiving passageway and including a first projecting portion projecting from said front surface, and a second projecting portion projecting from said rear surface, and a body portion within said passageway;
- first and second gasket members disposed over said front and rear surfaces of said dielectric member within said recess, each of said gasket members including a passageway for receiving said pin contact;
- a sleeve-shaped inductance member coaxially disposed over said pin contact body portion within said passageway, said inductance member having forward and rear ends substantially flush with said front and rear surfaces, respectively;
- first and second electrically conductive layers disposed on said front and rear dielectric member surfaces, respectively, said dielectric member and said inductance member isolating said first and second electrically conductive layers from direct electrical interengagement with each other;
- first and second solder bonds disposed exterior to said dielectric member and said conductive layer and electrically connecting said first and second layers to said first and second projecting portions of said contact pin, respectively;
- means including a third electrically conductive layer disposed within said dielectric member between said first and second layers for forming in conjunction therewith capacitive elements at respective ends of said body portion; and
- grounding means extending between said third conductive layer and said flange portion for electrically grounding said third conductive layer to establish in conjunction with said inductance member a pi-network filter element for said pin contact.

* * * * *